(12) United States Patent
Sicard (10) Patent No.: US 8,351,168 B2
(45) Date of Patent: Jan. 8, 2013

(54) OPEN CIRCUIT DETECTOR AND METHOD THEREFORE

(75) Inventor: Thierry Sicard, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 359 days.

(21) Appl. No.: 12/768,283

(22) Filed: Apr. 27, 2010

(65) Prior Publication Data

US 2011/0260772 A1    Oct. 27, 2011

(51) Int. Cl.
*H02H 7/08* (2006.01)

(52) U.S. Cl. ............. 361/23; 361/1; 318/432; 318/434; 318/490; 340/648

(58) Field of Classification Search .................. 361/18, 361/42, 23, 91.5; 318/400.21, 400.26; 323/276, 323/277; 363/50
See application file for complete search history.

(56) References Cited

U.S. PATENT DOCUMENTS

| | | | | | |
|---|---|---|---|---|---|
| 3,609,512 | A | * | 9/1971 | Lewis | 361/89 |
| 4,027,203 | A | * | 5/1977 | Moran et al. | 361/98 |
| 4,366,522 | A | * | 12/1982 | Baker | 361/91.7 |
| 4,492,883 | A | * | 1/1985 | Janutka | 327/377 |
| 4,720,641 | A | * | 1/1988 | Faini | 307/18 |
| 5,418,673 | A | * | 5/1995 | Wong | 361/18 |
| 5,623,254 | A | * | 4/1997 | Brambilla et al. | 340/644 |
| 6,135,096 | A | | 10/2000 | Bolz et al. | |
| 6,160,691 | A | * | 12/2000 | Shen et al. | 361/79 |
| 6,166,893 | A | * | 12/2000 | Shen et al. | 361/86 |
| 6,246,557 | B1 | * | 6/2001 | Bayer et al. | 361/42 |
| 6,552,885 | B1 | * | 4/2003 | Campbell et al. | 361/45 |
| 7,345,383 | B2 | * | 3/2008 | Zushi et al. | 307/130 |
| 7,808,756 | B2 | * | 10/2010 | Liu | 361/86 |
| 2001/0019470 | A1 | | 9/2001 | Hiwatari et al. | |
| 2006/0208969 | A1 | | 9/2006 | Berghegger | |
| 2007/0103988 | A1 | | 5/2007 | Bauer et al. | |
| 2008/0239593 | A1 | | 10/2008 | Lavier et al. | |
| 2009/0086513 | A1 | | 4/2009 | Lombardo et al. | |
| 2009/0153226 | A1 | | 6/2009 | Wicht et al. | |

OTHER PUBLICATIONS

U.S. Appl. No. 12/554,537, filed Sep. 4, 2009.
PCT/US2011/030745 International Search Report and Written Opinion mailed Nov. 1, 2011.
U.S. Appl. No. 12/811,804, filed Jul. 6, 2010.

* cited by examiner

*Primary Examiner* — Rita Leykin
(74) *Attorney, Agent, or Firm* — Joanna G. Chiu; Daniel D. Hill (57) ABSTRACT

A circuit comprises a switch, a driver circuit, and an open circuit detector. The switch has a first current electrode coupled to a power supply terminal, a second current electrode coupled to supply a current to a load, and a control electrode. The driver circuit has an input for receiving a control signal, and an output coupled to the control electrode of the switch. The open circuit detector has a first terminal coupled to receive a voltage from a bootstrap capacitor, a second terminal coupled to the power supply terminal, and a control terminal coupled to the driver circuit. The open circuit detector detects an open circuit, and in response, provides a signal at the control terminal for causing the driver circuit to open the switch.

20 Claims, 2 Drawing Sheets

OPEN CIRCUIT DETECTOR AND METHOD THEREFORE

BACKGROUND

1. Field

This disclosure relates generally to circuits, and more specifically, to an open circuit detector.

2. Related Art

High side switches are commonly used to switch a supply voltage to a load, such as a motor. Such high side switches can be used in a variety of applications, such as in automotive applications. These high side switches are driven by high side drivers and are capable of delivering high peak currents. However, a problem arises when these high side drivers lose their ground connection, such as due to a broken wire connection. The loss of the ground connection may result in the high side switch unintentionally turning on and thus operating the inductive load uncontrollably. Therefore, a need exists for a high side driver circuit with improved safety in the case of an open circuit condition.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a circuit includes a high side switch coupled to supply current to a load, such as, for example, an electric motor. A high side driver circuit receives a control signal and has an output coupled to the high side switch to control the turning on and off of the high side switch. The circuit further includes an open circuit detector which, in response to detecting an open circuit condition, causes the high side driver circuit to turn off the switch, thus preventing the load (e.g. the motor) from unintentionally running. In one embodiment, the open circuit condition corresponds to a loss of a ground connection for the driver circuit. Also, in one embodiment, the open circuit detector is supplied by a bootstrap capacitor which is coupled to the load. This bootstrap capacitor allows the open circuit detector to have time to detect the open circuit condition (e.g. the loss of ground) and cause the high side driver to turn off the switch to ensure that the load does not get turned on unintentionally.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Also, as used herein, when a switch (such as switch 14, to be described in more detail below) is "on", it may be referred to as being in a conductive state or as "open," and when "off", it may be referred to as being in a non-conductive state or as "closed."

Figure 1:
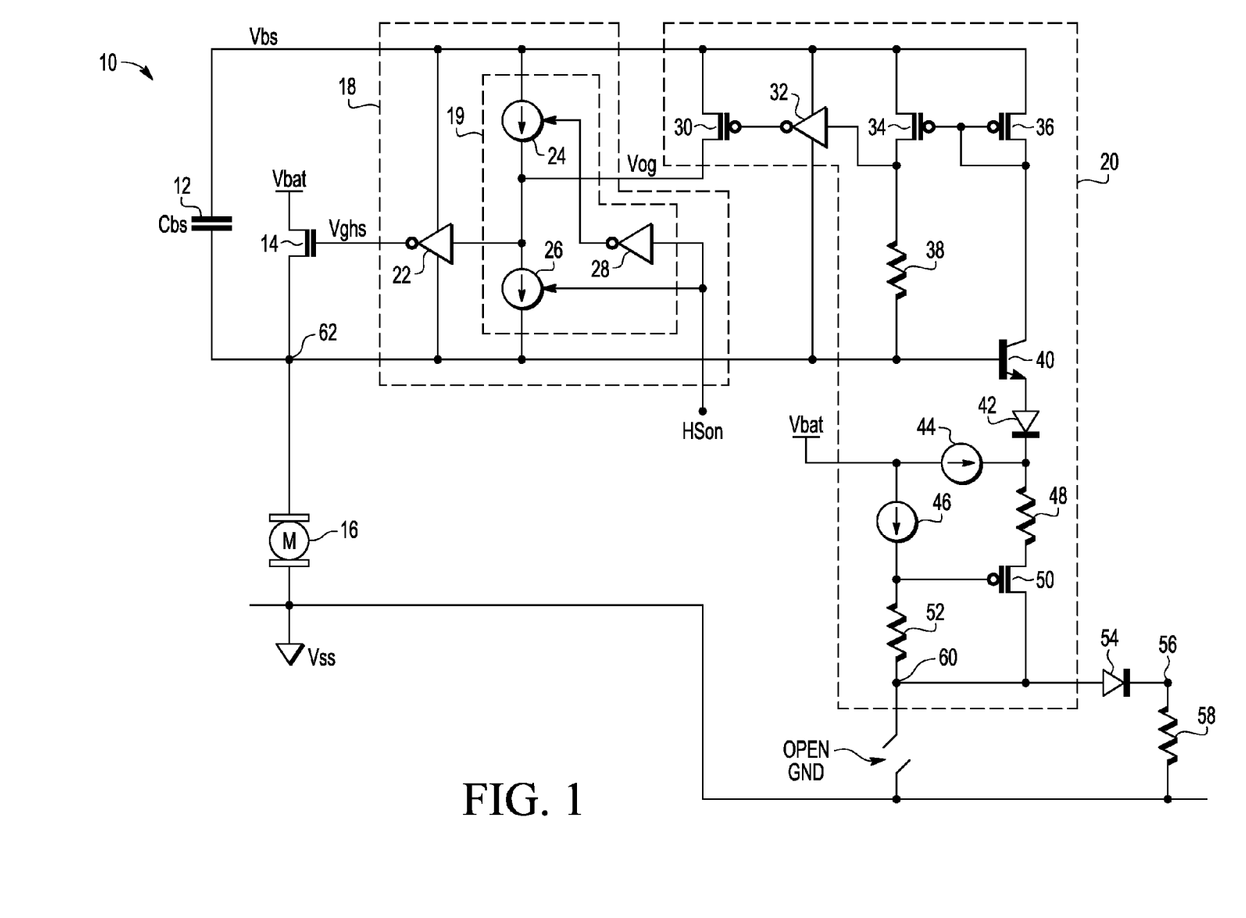
FIG. 1 illustrates, in schematic form, a circuit 10 having an open circuit detector, in accordance with one embodiment of the present invention.

FIG. 1 illustrates a circuit 10 in accordance with one embodiment of the operation. Circuit 10 includes a bootstrap capacitor (Cbs) 12, a high side switch 14 (which, in one embodiment, may be a power NMOS transistor), a motor 16 (which, in alternate embodiments, may be other types of loads), a driver circuit 18, an open circuit detector 20 (which may also be referred to as an open ground detector 20), a high impedance resistor 58, a diode 54, a first power supply terminal Vbat (to receive, for example, a first voltage supply, such as from a battery), and a second power supply terminal Vss (which, for example, may be ground). Driver circuit 18 includes a driver 22 (which, in one embodiment, may be implemented as an inverter) and a pre-driver circuit 19. Pre-driver circuit 19 includes a current source 24, a current source 26, and an inverter 28. Open circuit detector 20 includes a PMOS transistor 30, an inverter 32, a current mirror (which includes a PMOS transistor 34 and a PMOS transistor 36), a resistor 38, a bipolar transistor 40, a diode 42, a resistor 48, current sources 46 and 44, a transistor 50, a resistor 52, and a circuit node 60. A first current electrode of switch 14 is connected to the first power supply terminal, Vbat, a control electrode is connected to an output of driver circuit 18, and a second current electrode connected to a first terminal of motor 16 to supply current to motor 16. A second terminal of motor 16 is connected to the second power supply terminal, Vss. A circuit node 62 is defined at the second current electrode of switch 14. An output of driver 22 is connected to the control electrode of switch 14 to provide the control electrode of switch 14 with the output of driver circuit 18. A first power supply input of driver 22 is connected to a first plate electrode of Cbs 12, and a second power supply input of driver 22 is connected to circuit node 62, which is also connected to a second plate electrode of Cbs 12. A first terminal of current source 24 is connected to the first plate electrode of Cbs 12, and a second terminal of current source 24 is connected to an input of driver 22. A control input of current source is connected to an output of inverter 28. A first terminal of current source 26 is connected to the input of driver 22, a second terminal of current source 26 is connected to node 62, and a control terminal of current source 26 is coupled to receive control signal HSon. HSon is also provided to an input of inverter 28. Transistor 30 has a first current electrode connected to the first plate electrode of Cbs 12, a second current electrode connected to the input of driver 22, and a control electrode coupled to an output of inverter 32. Inverter 32 has a first power supply input connected to the first plate electrode of Cbs 12, a second power supply input connected to node 62, and an input. PMOS transistor 34 has a first current electrode connected to the first plate electrode of Cbs 12, a control electrode, and a second current electrode connected to the input of inverter 32 and connected to a first terminal of resistor 38. Resistor 38 has a second terminal connected to node 62. PMOS transistor 36 has a first current electrode connected to the first plate electrode of Cbs 12, a control electrode connected to the control electrode of PMOS transistor 34, and a second current electrode connected to the control electrode of PMOS transistor 36 and connected to a first current electrode of bipolar device 40. Bipolar device 40 has a control electrode connected to node 62 and a second current electrode connected to an anode of diode 42. A first terminal of each of current sources 44 and 46 is connected to the first power supply terminal, Vbat. A second terminal of current source 44 is connected to a cathode of diode 42 and to a first terminal of resistor 48. PMOS transistor 50 has a first current electrode connected to a second terminal of resistor 48, a control electrode connected to a second terminal of current source 46 and a first terminal of resistor 52, and a second current electrode connected to node 60. A second terminal of resistor 52 is connected to node 60, and node 60 is connected to an anode of diode 54. A cathode of diode 54 is connected to a node 56 and is connected to a first terminal of a large resistor 58. A second terminal of resistor 58 is connected to the second power supply terminal, Vss.

In one embodiment, driver circuit 18 and open circuit detector 20 are located on a same integrated circuit which is packaged together with switch 14. In one embodiment, Cbs 12, resistor 58, and motor 16 is supplied external to the package containing switch 14 and the circuits 18 and 20. In alternate embodiments, any number of integrated circuits can be used to implement circuits 18 and 20 and they may or may not be packaged in a same package with switch 14.

In one embodiment, nodes 62 and 56 correspond to input/output (I/O) terminals of the package. In one embodiment, a microcontroller (not illustrated) is coupled to driver circuit 18 and open ground detector 20 where this microcontroller can be used to control HSon. In one embodiment, node 56 of circuit 10 represents any circuit node or terminal of open ground detector 20 which can be coupled to an I/O terminal of the microcontroller (or to Vss). In the illustrated embodiment, node 56 is coupled to an I/O terminal of the microcontroller (or to Vss) by way of a large resistor 58 (having a resistance, for example, of approximately 10K Ohms) which results in a high impedance at node 56. In one embodiment, resistor 58 is included between the driver circuit and the microcontroller to protect the microcontroller's I/Os. In one embodiment, the path from node 56 through resistor 58 progresses through a path within the microcontroller to Vss. Alternatively, the path from node 56 through resistor 58 progresses to Vss without going through the microcontroller.

In one embodiment, such as in an automotive application, Vss may represent the automobile's ground, such as a chassis connection. Node 60 may be referred to as a floating ground or a ground node of driver circuit 18 and open ground detector 20. When node 60 is coupled to Vss, then circuit 10 operates normally in which driver 22 is controlled by pre-driver 19 (as will be described in more detail below). However, when node 60 is not coupled to Vss, an open ground condition is present. During an open ground condition, due to the large resistance of resistor 58, only high impedance paths are available for current to flow (since node 60 is no longer coupled to Vss).

During normal operation of circuit 10, in which the ground node of driver circuit 18 and open ground detector 20 is coupled to Vss, such as via node 60, the input to driver 22 is controlled by pre-driver circuit 19. In the illustrated embodiment, pre-driver circuit 19 is formed by current sources 24 and 26 and inverter 28. For example, during normal operation, when the input HSon is asserted (as controlled, for example, by a microcontroller which is coupled to circuit 10), current source 26 is enabled and the output of inverter 28 goes low (e.g. to a logic level zero) such that current source 24 is disabled, thus pulling the input to driver 22 low (e.g. to a logic level zero). The output of driver 22 goes high (e.g. to a logic level one) thus turning on switch 14 which turns on motor 16. During normal operation, when the input HSon is negated, current source 26 is disabled and the output of inverter 28 goes high (e.g. to a logic level one) such that current source 24 is enabled, thus pulling the input to driver 22 high (e.g. to a logic level one). Therefore, the output of driver 22 goes low (e.g. to a logic level zero) thus turning off switch 14 which turns off motor 16. Note that the illustrated implementation of pre-driver circuit 19 has been simplified for ease of explanation and other pre-driver circuits, as known in the art, may be used to implement the functionality of pre-driver circuit 19.

Also, during normal operation, note that node 60 is coupled to Vss (and thus an open ground condition is not present). In this case, current sources 46 and 44 are powered by Vbat and Vss to maintain transistor 50 off. With transistor 50 off, no current is provided through transistor 50 nor through transistors 34 and 36. Therefore, the input of inverter 32 is low (e.g. at a logic level zero), and the output of inverter 32 is high (e.g. at a logic level one). Therefore, transistor 30 is off. In this manner, with transistor 30 off, open ground detector circuit 20 is disabled and the input of driver 22 is controlled by pre-driver circuit 19 and not the output, Vog, of open ground detector 20.

During an open ground condition (in which node 60 is no longer coupled to Vss), open ground detector circuit 20 is powered by the charge stored in Cbs 12 and the output, Vog, of open ground detector circuit 20 (e.g. the signal present at the second current electrode of transistor 30) bypasses pre-driver circuit 19 to control the input of driver 22. Open ground detector 20 has a first terminal coupled to receive the voltage Vbs from Cbs 12, a second terminal coupled to Vbat, and a control terminal (which provides a control voltage or control signal, e.g. Vog) coupled to driver 22. When an open ground is detected, transistor 30 is turned on and Vog at the output of open ground detector circuit 20 goes high (e.g. to a logic level one). Therefore, the output of driver 22 goes low (e.g. to a logic level zero), thus turning switch 14 off and ensuring that motor 16 turns off as well. An open ground condition occurs when node 60 is somehow disconnected from Vss (such as due to a broken wire or other defects in the circuitry). When an open ground occurs, the path to ground becomes a high impedance path provided via node 56, through resistor 58, to Vss. This high impedance path may progress, for example, through the microcontroller as described above. In this case, the charge stored in Cbs 12 provides the voltage Vbs to the current mirror formed by transistors 34 and 36. Also, current sources 46 and 44 are disabled due to the open ground condition and the control electrode of transistor 50 is pulled low, thus turning on transistor 50. Therefore, with Vbs providing power to open ground detector 20, current flows through transistors 36, 40, and 50 and through diode 54 and resistor 58 to Vss. Therefore, transistor 34 mirrors the current present through transistor 36, thus pulling the input of inverter 32 high (e.g. to a logic level one). Therefore, the output of inverter 32 goes low (e.g. to a logic level zero), thus turning on transistor 30. In this manner, the output of driver 22 is forced low, thus turning off switch 14 in response to detection of the open ground condition.

Note that in the illustrated embodiment, diode 54 is a parasitic diode present between the P-substrate and the N-wells within the P-substrate in the case that ground is lost (in an open ground condition). Also, in the illustrated embodiment, transistor 40 is implemented as a bipolar transistor because a low impedance is desired. However, in alternate embodiments, other types of transistor can be used, such as an MOS transistor.

Therefore, as described in referenced to FIG. 1, open ground detector 20 is capable of using a path from Cbs 12 to Vss (through resistor 58) in order to detect an open circuit condition. Also, note that the open circuit condition can be located elsewhere and result in an open ground condition. In one embodiment, as will be described below in reference to FIG. 2, no path to ground may be present during an open circuit condition. Therefore, an open circuit detector, such as open circuit detector 102 of FIG. 2, can be used to detect an open circuit condition by using a current path between Cbs 12 and the supply voltage terminal, Vbat (as opposed to a current path between Cbs 12 and the supply voltage terminal, Vss, since no path, including no high impendence path, may be present between the open circuit detector and Vss).

Figure 2:
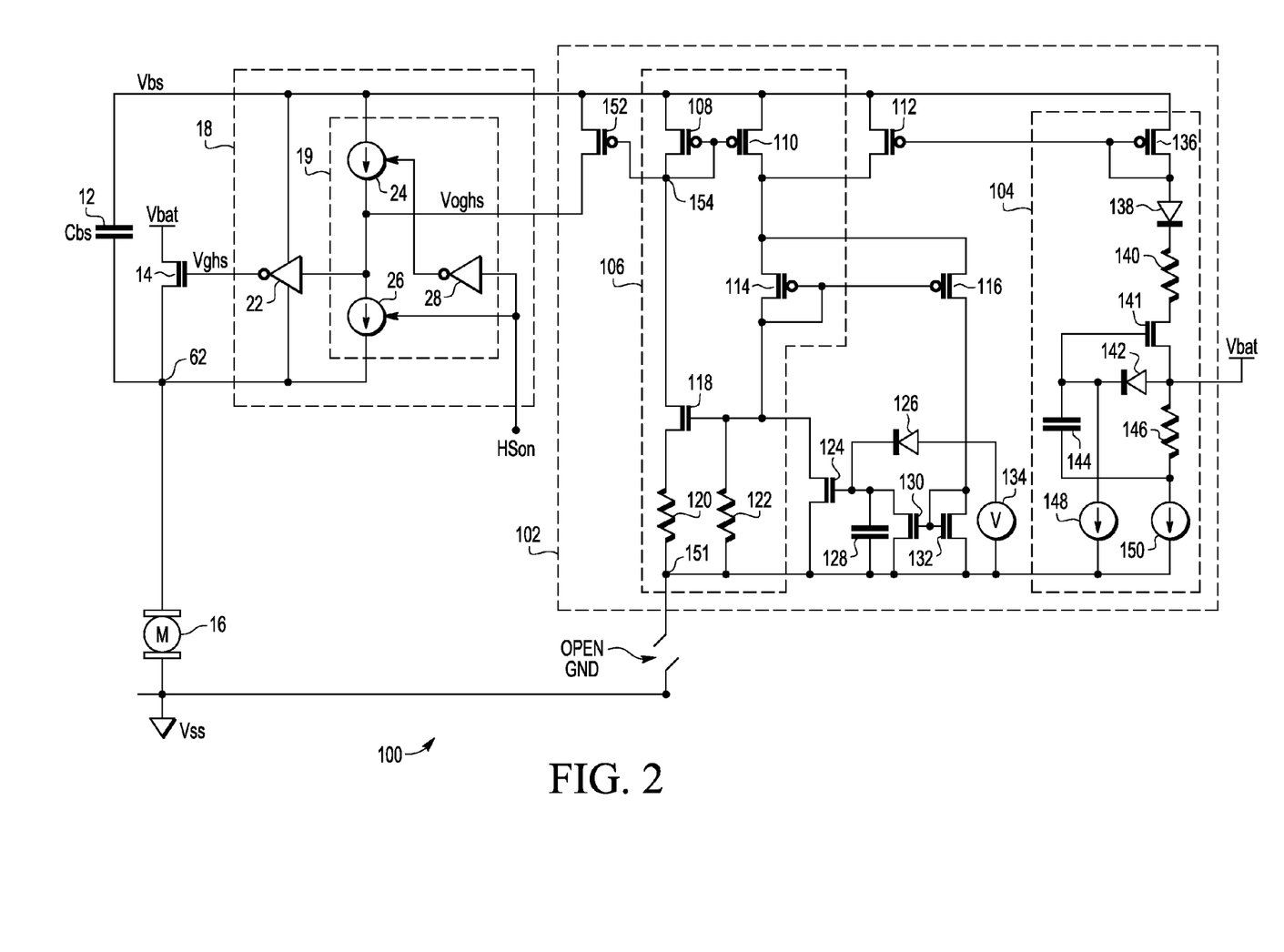
FIG. 2 illustrates, in schematic form, a circuit 100 having an open circuit detector, in accordance with one embodiment of the present invention.

FIG. 2 illustrates a circuit 100 in accordance with an alternate embodiment of the present invention. Circuit 100 includes Cbs 12, switch 14, motor 16, driver circuit 18, an open circuit detector 102 (which may also be referred to as an open ground detector 102), the first power supply terminal Vbat, and the second power supply terminal Vss. Note that like reference numerals in FIGS. 1 and 2 indicate similar elements; therefore, connectivity of Cbs 12, switch 14, motor 16, and driver circuit 18 are the same as that described above in reference to FIG. 1. Open circuit detector 102 includes PMOS transistors 152, 108, 110, 114, 112, and 136, NMOS transistors 118, 124, 130, 132, and 141, diodes 126, 138, and 142, resistors 120, 122, 146, and 140, capacitor 144, voltage source 134, and current sources 148 and 150. Latch circuit 106 includes transistors 108, 110, 114, and 118, and resistors 120 and 122. Core detector circuit 104 includes transistors 136 and 141, diodes 138 and 142, resistors 140 and 146, capacitor 144, and current sources 148 and 150. Transistor 152 has a first current electrode connected to the first plate electrode of Cbs 12, a second current electrode connected to the input of driver 22, and a control electrode connected to a circuit node 154. Transistor 108 has a first current electrode connected to the first plate electrode of Cbs 12, a control electrode connected to node 154, and a second current electrode connected to node 154. Transistor 110 has a first current electrode connected to the first plate electrode of Cbs 12, a control electrode connected to the control electrode of transistor 108, and a second current electrode. Transistor 112 has a first current electrode connected to the first plate electrode of Cbs 12, a control electrode, and a second current electrode connected to the second current electrode of transistor 110. Transistor 136 has a first current electrode connected to the first plate electrode of Cbs 12, a control electrode connected to the control electrode of transistor 112, and a second current electrode connected to the control electrode of transistor 136. Transistor 118 includes a first current electrode connected to node 154, a control electrode connected to a first terminal of resistor 122, and a second current electrode connected to a first terminal of resistor 120. A second terminal of resistor 120 is connected to a circuit node 151. A second terminal of resistor 122 is connected to circuit node 151. Transistor 114 has a first current electrode connected to the second current electrode of transistor 110, a control electrode, and a second current electrode connected to the control electrode of transistor 114, to the first terminal of resistor 122, and to the control electrode of transistor 118. Transistor 124 has a first current electrode connected to the second current electrode of transistor 114, a control electrode, and a second current electrode connected to node 151. Capacitor 128 has a first plate electrode connected to the control electrode of transistor 124 and a second plate electrode connected to circuit node 151. Transistor 130 has a first current electrode connected to the first plate electrode of capacitor 128, a control electrode, and a second current electrode connected to node 151. Transistor 132 has a first current electrode connected to the control electrode of transistor 130, a control electrode connected to the control electrode of transistor 130, and a second current electrode connected to node 151. Diode 126 has a cathode connected to the first plate electrode of capacitor 128 and an anode connected to the first current electrode of transistor 132. Voltage source 134 has a first terminal connected to the first current electrode of transistor 132 and a second terminal connected to node 151. Transistor 116 has a first current electrode connected to the first current electrode of transistor 114, a control electrode connected to the control electrode of transistor 114, and a second current electrode connected to the first current electrode of transistor 132. Diode 138 has an anode connected to the second current electrode of transistor 136 and a cathode connected to a first terminal of resistor 140. A second terminal of resistor 140 is connected to a first current electrode of transistor 141. Transistor 141 has a control electrode and a second current electrode connected to the first power supply terminal, Vbat. Diode 142 has an anode connected to the second current electrode of transistor 141 and a cathode connected to the control electrode of transistor 141. Capacitor 144 has a first plate electrode connected to the control electrode of transistor 141, and a second plate electrode. A first terminal of resistor 146 is connected to the second current electrode of transistor 141, and a second terminal of resistor 146 is connected to a first terminal of current source 150 and to the second plate electrode of capacitor 144. A first terminal of current source 148 is connected to the first plate electrode of capacitor 144, and a second terminal of current source 148 is connected to node 151. A second terminal of current source 150 is connected to node 151.

Note that like reference numerals in FIGS. 1 and 2 indicate similar elements. Connectivity and operation of Cbs 12, high side switch 14, motor 16, and driver circuit 18 are the same as that described above in reference to FIG. 1. That is, for example, during normal operation, driver 22 of driver circuit 18 is controlled by HSon which can be controlled, for example, by a microcontroller which can be coupled to driver circuit 18, as described above. Open circuit detector 102 provides the output, Vog, which controls driver 22 when an open circuit is detected. In one embodiment, such as in an automotive application, Vss may represent the automobile's ground, such as a chassis connection. Node 151 may be referred to as a floating ground or a ground node of driver circuit 18 and open circuit detector 102. When node 151 is coupled to Vss, then circuit 100 operates normally in which driver 22 is controlled by pre-driver 19. However, when node 151 is not coupled to Vss, an open ground condition is present.

During normal operation in which no open circuit is present, note that capacitor 144 is charged by current sources 148 and 150 and transistor 141 is off. Therefore, no current is provided from Cbs 12 through core detection portion 104. Also, no current is present through transistor 112, since it operates as a current mirror with transistor 136. Similarly, voltage source 134 charges capacitor 128 through diode 126, thus transistor 124 is on and transistor 118 is off. Therefore, transistors 108 and 110 are also off, and transistor 152, whose control electrode is coupled to node 154 of the current mirror formed by transistors 108 and 110, is off as well. In this manner, with transistor 152 off, open circuit detector 102 is disabled and the input of driver 22 is controlled by pre-driver circuit 19 and not the output, Vog, of open circuit detector 20.

During an open circuit condition of FIG. 2, the output, Vog, of open circuit detector circuit 102 (e.g. the signal present at the second current electrode of transistor 152) is powered by the charge stored in Cbs 12 and bypasses pre-driver circuit 19 to control the input of driver 22. Open circuit detector 102 has a first terminal coupled to receive the voltage Vbs from Cbs 12, a second terminal coupled to Vbat, and a control terminal (which provides a control voltage or control signal, e.g. Vog) coupled to driver 22. When an open circuit is detected, transistor 152 is turned on and Vog at the output of open circuit detector 102 goes high (e.g. to a logic level one). Therefore, the output of driver 22 goes low (e.g. to a logic level zero), thus turning switch 14 off and ensuring that motor 16 turns off as well. In the illustrated embodiment of FIG. 2, an open circuit condition may correspond to an open ground condition in which node 151 is somehow disconnected from Vss (such as due to a broken wire or other defects in the circuitry). Also, in the illustrated embodiment, no alternate path to ground is present. For example, even if a large resistor were connected between a circuit node of open circuit detector 102 (such as node 151) and an I/O pin of the microcontroller (as was described in reference to resistor 58 of FIG. 1), an open circuit condition could also be present within the microcontroller itself thus preventing the existence of any path, including any high impedance path, to Vss. In this case, since no alternate path to ground is present when node 151 of open circuit detector 102 loses ground, current from Cbs 12 to Vbat is used to detect the presence of an open circuit. Furthermore, even if an alternate high impedance path to ground were present (such as via a high impedance resistor, as was the case in FIG. 1), open circuit detector 102 can still detect the presence of an open circuit using the path from Cbs 12 to Vbat.

When an open condition occurs in the embodiment of FIG. 2, the charge stored in Cbs 12 provides the voltage Vbs to the current mirror formed by transistors 112 and 136. Also, current sources 148 and 150 are disabled due to the open ground condition. Note that even if a high impedance path to ground were present from node 151 to Vss, such as via a large resistor, the current draw would not be sufficient to maintain current sources 148 and 150 enabled, and they would still be disabled (i.e. turned off). Therefore, no current is present through resistor 146; however, capacitor 144 maintains its charge. Since the voltage at the first plate electrode of capacitor 144 (which is coupled to the control electrode of transistor 141) now goes higher than the voltage Vbat (due to the open circuit condition), transistor 141 is turned on, and current now flows from Cbs 12 through transistor 136, diode 138, resistor 140, transistor 141, to Vbat. That is, during an open circuit condition, current flows from Cbs 12 through core detector 104 to Vbat. Since transistor 112 operates as a current mirror with transistor 136, current flows through transistor 112. This current flows through transistor 114 and resistor 122, thus turning on transistor 110. Transistor 108, which forms a current mirror with transistor 110, is therefore also turned on. However, no current flows through transistor 108 since transistor 118 is not immediately turned on. That is, capacitor 128 operates as a delay element to delay turning on of transistor 118, which delays the latching function of latch circuit 106. Thus transistor 152 is not turned on and Vog does not bypass pre-driver circuit 19 to control driver 22 until a delay period after the open circuit condition occurs.

For example, as illustrated in FIG. 2, when an open ground condition occurs, voltage source 134 is no longer operational, and the charge stored capacitor 128 allows transistor 124 to remain on, even after the occurrence of an open circuit condition. This, in turn, maintains transistor 118 off (thus latch 106 is not yet enabled). In response to the occurrence of an open circuit condition, the current mirror formed by transistors 114 and 116 and the current mirror formed by transistors 130 and 132 begin to discharge capacitor 128. Once capacitor 128 is sufficiently discharged, transistor 124 is turned off which results in transistor 118 turning on. In response to transistor 118 turning on, latch circuit 106 latches the current, and transistor 152 is turned on, thus allowing Vog to control driver 22. That is, Vog is pulled high (e.g. to a logic level one), which forces the output of driver 22, Vghs, to go low (e.g. to a logic level zero), thus ensuring that motor 16 turns off. Capacitor 128 therefore operates as a delay element which prevents latch 106 from providing the output signal, Vog, until after a predetermined delay (i.e. predetermined time period). The delay time between the occurrence of an open circuit condition to the time transistor 152 is turned on to control driver 22 can be varied as needed by varying, for example, capacitor 128 or the circuitry present to discharge capacitor 128 (such as the current mirrors formed by transistors 114 and 116 and transistors 130 and 132). In yet another alternate embodiment, no delay circuit may be present such that transistor 152 is turned on in response to occurrence of an open circuit condition, without any additional delay. In this case, the second current electrodes of transistors 112 and 112 can be connected directly to the control electrode of transistor 118, and transistors 114, 116, 130, and 132, along with capacitor 128, diode 126, and voltage source 134, may not be present.

By now it should be appreciated that there has been provided a circuit which is capable of detecting an open circuit condition (such as an open ground condition) and forcing the high side switch to turn off in response thereto. Furthermore, the detection circuit which detects the open circuit condition is capable of being powered by the bootstrap capacitor which therefore prevents the need of an additional power source. In this manner, safety of such applications which may use a high side switch, such as switch 14, may be improved.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, an open circuit condition can be detected by detecting current in a path between Cbs and Vss or in a path between Cbs and Vbat. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a circuit having a switch having a first current electrode coupled to a power supply terminal, a second current electrode coupled to supply a current to a load, and a control electrode; a driver circuit having an input for receiving a control signal, and an output coupled to the control electrode of the switch; and an open circuit detector having a first terminal coupled to receive a voltage from a bootstrap capacitor, a second terminal coupled to the power supply terminal, and a control terminal coupled to the driver circuit, the open circuit detector for detecting an open circuit, and in response, providing a signal at the control terminal for causing the driver circuit to open the switch. Item 2 includes the circuit of item 1, wherein the switch is further characterized as being a high side switch for controlling an electric motor. Item 3 includes the circuit of item 1, wherein the open circuit detector is supplied by the bootstrap capacitor when the open circuit is detected. Item 4 includes the circuit of item 1, wherein the open circuit detector includes a first current source having a first terminal coupled to the power supply terminal, and a second terminal; a second current source having a first terminal coupled to the power supply terminal, and a second terminal; a first resistor having a first terminal coupled to the second terminal of the second current source, and a second terminal; a first transistor having a first current electrode coupled to the second terminal of the first resistor, a second current electrode, and a control electrode coupled to the second terminal of the first current source; and a second resistor having a first terminal control electrode of the first transistor, and a second terminal coupled to the second current electrode of the first transistor. Item 5 includes the circuit of item 4, wherein the open circuit detector further includes a second transistor having a first current electrode, a control electrode coupled to the second current electrode of the switch, and a second current electrode coupled to the first terminal of the first resistor; and a current mirror having an input coupled to the first current electrode of the second transistor, and an output for providing the signal at the control terminal. Item 6 includes the circuit of item 5, wherein the second transistor is characterized as being a bipolar transistor. Item 7 includes the circuit of item 1, wherein the open circuit detector includes a first current source having a first terminal, and a second terminal; a second current source having a first terminal, and a second terminal coupled to the second terminal; a capacitor having a first plate electrode coupled to the first terminal of the first current source, and a second plate electrode coupled to the first terminal of the second current source; a resistor having a first terminal coupled to the power supply terminal, and a second terminal coupled to the first terminal of the second current source; and a transistor having a first current electrode, a control electrode coupled to the first plate electrode of the capacitor, and a second current electrode coupled to the power supply terminal. Item 8 includes the circuit of item 7, wherein the open circuit detector includes a first current mirror having a first terminal coupled to the first current electrode of the transistor, and a second terminal; a latch having an input coupled to the second terminal of the first current mirror, and an output for providing the signal to the control terminal of the open circuit detector; and a delay element coupled to the latch, the delay element for preventing the latch from providing the signal until after a predetermined delay. Item 9 includes the circuit of item 1, wherein the open circuit is a loss of ground.

Item 10 includes a circuit having a power transistor having a first current electrode coupled to a power supply terminal, a second current electrode coupled to supply a current to a load, and a control electrode; a driver circuit having an input for receiving a control signal, and an output coupled to the control electrode of the power transistor; and an open circuit detector having a first terminal coupled to receive a voltage from a bootstrap capacitor, a second terminal coupled to the power supply terminal, and a control terminal coupled to the driver circuit, the open circuit detector for detecting an open ground in the driver circuit, and in response, providing a signal at the control terminal for causing the driver circuit to turn off the power transistor. Item 11 includes the circuit of item 10, wherein the open circuit detector provides an alternate current path to ground in response to detecting the open ground in the driver circuit. Item 12 includes the circuit of item 10, wherein the open circuit detector includes a first transistor having a first current electrode, a control electrode, and a second current electrode; a first resistor having a first terminal, and a second terminal coupled to the first current electrode of the first transistor; a second resistor having a first terminal coupled to the control terminal of the first transistor, and a second terminal coupled to the second current electrode of the first transistor; a second transistor having a first current electrode, a control electrode coupled to the second current electrode of the power transistor, and a second current electrode coupled to the first terminal of the first resistor; and a current mirror having an input coupled to the first current electrode of the second transistor, and an output for providing the signal at the control terminal. Item 13 includes the circuit of item 12, wherein the second transistor is a bipolar transistor. Item 14 include the circuit of item 10, wherein the open circuit detector includes a first transistor having a first current electrode, a control electrode, and a second current electrode; a capacitor having a first plate electrode coupled to the control electrode, and a second plate electrode; a current mirror having an input coupled to the first current electrode of the first transistor, and an output; a latch having an input coupled to the output of the current mirror, and an output for providing the signal at the control terminal; and a delay circuit coupled to prevent the latch from providing the signal until after a predetermined delay. Item 15 includes the circuit of item 10, wherein the open circuit detector provides a current path from the bootstrap capacitor to the power supply terminal in response to detecting the open ground in the driver circuit.

In a circuit for driving a control electrode of a power transistor, item 16 includes a method for detecting an open circuit including providing an alternate current path in response to detecting the open circuit; supplying a current to the alternate current path using a voltage stored by a bootstrap capacitor; and providing a control voltage in response to the current, the control voltage for causing the power transistor to turn off. Item 17 includes the method of item 16, wherein detecting the open circuit further comprises detecting an open ground. Item 18 includes the method of item 16, wherein the providing the control voltage further includes mirroring the current to provide a mirrored current; and latching the control voltage in response to the mirrored current. Item 19 includes the method of item 18, and further includes delaying the latching for a predetermined time period. Item 20 includes the method of item 19, wherein the predetermined time period is a time period required to discharge a capacitor.

What is claimed is:

1. A circuit comprising:
    a switch having a first current electrode coupled to a power supply terminal, a second current electrode coupled to supply a current to a load, and a control electrode;
    a driver circuit having an input for receiving a control signal, and an output coupled to the control electrode of the switch; and
    an open circuit detector having a first terminal coupled to receive a voltage from a bootstrap capacitor, a second terminal coupled to the power supply terminal, and a control terminal coupled to the driver circuit, the open circuit detector for detecting an open circuit, and in response, providing a signal at the control terminal for causing the driver circuit to open the switch,
    wherein the open circuit detector comprises:
        a first current source having a first terminal coupled to the power supply terminal, and a second terminal;
        a second current source having a first terminal coupled to the power supply terminal, and a second terminal;
        a first resistor having a first terminal coupled to the second terminal of the second current source, and a second terminal;
        a first transistor having a first current electrode coupled to the second terminal of the first resistor, a second current electrode, and a control electrode coupled to the second terminal of the first current source; and
        a second resistor having a first terminal control electrode of the first transistor, and a second terminal coupled to the second current electrode of the first transistor.

2. The circuit of claim 1, wherein the switch is further characterized as being a high side switch for controlling an electric motor.

3. The circuit of claim 1 wherein the open circuit detector is supplied by the bootstrap capacitor when the open circuit is detected.

4. The circuit of claim 1, wherein the open circuit detector further comprises:
    a second transistor having a first current electrode, a control electrode coupled to the second current electrode of the switch, and a second current electrode coupled to the first terminal of the first resistor; and
    a current mirror having an input coupled to the first current electrode of the second transistor, and an output for providing the signal at the control terminal.

5. The circuit of claim 4, wherein the second transistor is characterized as being a bipolar transistor.

6. A circuit comprising:
    a switch having a first current electrode coupled to a power supply terminal, a second current electrode coupled to supply a current to a load, and a control electrode;
    a driver circuit having an input for receiving a control signal, and an output coupled to the control electrode of the switch; and
    an open circuit detector having a first terminal coupled to receive a voltage from a bootstrap capacitor, a second terminal coupled to the power supply terminal, and a control terminal coupled to the driver circuit, the open circuit detector for detecting an open circuit, and in response, providing a signal at the control terminal for causing the driver circuit to open the switch,
    wherein the open circuit detector comprises:
        a first current source having a first terminal, and a second terminal;
        a second current source having a first terminal, and a second terminal coupled to the second terminal;
        a capacitor having a first plate electrode coupled to the first terminal of the first current source, and a second plate electrode coupled to the first terminal of the second current source;
        a resistor having a first terminal coupled to the power supply terminal, and a second terminal coupled to the first terminal of the second current source; and
        a transistor having a first current electrode, a control electrode coupled to the first plate electrode of the capacitor, and a second current electrode coupled to the power supply terminal.

7. The circuit of claim 6, wherein the open circuit detector comprises:
    a first current mirror having a first terminal coupled to the first current electrode of the transistor, and a second terminal;
    a latch having an input coupled to the second terminal of the first current mirror, and an output for providing the signal to the control terminal of the open circuit detector; and
    a delay element coupled to the latch, the delay element for preventing the latch from providing the signal until after a predetermined delay.

8. The circuit of claim 1, wherein the open circuit is a loss of ground.

9. The circuit of claim 6, wherein the switch is further characterized as being a high side switch for controlling an electric motor.

10. The circuit of claim 6 wherein the open circuit detector is supplied by the bootstrap capacitor when the open circuit is detected.

11. The circuit of claim 6, wherein the open circuit is a loss of ground.

12. A circuit comprising:
    a power transistor having a first current electrode coupled to a power supply terminal, a second current electrode coupled to supply a current to a load, and a control electrode;
    a driver circuit having an input for receiving a control signal, and an output coupled to the control electrode of the power transistor; and
    an open circuit detector having a first terminal coupled to receive a voltage from a bootstrap capacitor, a second terminal coupled to the power supply terminal, and a control terminal coupled to the driver circuit, the open circuit detector for detecting an open ground in the driver circuit, and in response, providing a signal at the control terminal for causing the driver circuit to turn off the power transistor, wherein the open circuit detector comprises:
        a first transistor having a first current electrode, a control electrode, and a second current electrode;
        a first resistor having a first terminal, and a second terminal coupled to the first current electrode of the first transistor;

a second resistor having a first terminal coupled to the control terminal of the first transistor, and a second terminal coupled to the second current electrode of the first transistor;

a second transistor having a first current electrode, a control electrode coupled to the second current electrode of the power transistor, and a second current electrode coupled to the first terminal of the first resistor; and a current mirror having an input coupled to the first current electrode of the second transistor, and an output for providing the signal at the control terminal.

13. The circuit of claim 12, wherein the open circuit detector provides an alternate current path to ground in response to detecting the open ground in the driver circuit.

14. The circuit of claim 12, wherein the second transistor is a bipolar transistor.

15. A circuit comprising:

a power transistor having a first current electrode coupled to a power supply terminal, a second current electrode coupled to supply a current to a load, and a control electrode;

a driver circuit having an input for receiving a control signal, and an output coupled to the control electrode of the power transistor; and an open circuit detector having a first terminal coupled to receive a voltage from a bootstrap capacitor, a second terminal coupled to the power supply terminal, and a control terminal coupled to the driver circuit, the open circuit detector for detecting an open ground in the driver circuit, and in response, providing a signal at the control terminal for causing the driver circuit to turn off the power transistor, wherein the open circuit detector comprises:

a first transistor having a first current electrode, a control electrode, and a second current electrode;

a capacitor having a first plate electrode coupled to the control electrode, and a second plate electrode;

a current mirror having an input coupled to the first current electrode of the first transistor, and an output;

a latch having an input coupled to the output of the current mirror, and an output for providing the signal at the control terminal; and a delay circuit coupled to prevent the latch from providing the signal until after a predetermined delay.

16. The circuit of claim 15, wherein the open circuit detector provides a current path from the bootstrap capacitor to the power supply terminal in response to detecting the open ground in the driver circuit.

17. In a circuit for driving a control electrode of a power transistor, a method for detecting an open circuit, the method comprising:

providing an alternate current path in response to detecting the open circuit;

supplying a current to the alternate current path using a voltage stored by a bootstrap capacitor; and providing a control voltage in response to the current, the control voltage for causing the power transistor to turn, wherein the providing the control voltage further comprises:

mirroring the current to provide a mirrored current; and latching the control voltage in response to the mirrored current.

18. The method of claim 17, wherein detecting the open circuit further comprises detecting an open ground.

19. The method of claim 17, further comprising delaying the latching for a predetermined time period.

20. The method of claim 19, wherein the predetermined time period is a time period required to discharge a capacitor.

* * * * *

UNITED STATES PATENT AND TRADEMARK OFFICE
CERTIFICATE OF CORRECTION

| | | |
|---|---|---|
| PATENT NO. | : 8,351,168 B2 | Page 1 of 1 |
| APPLICATION NO. | : 12/768283 | |
| DATED | : January 8, 2013 | |
| INVENTOR(S) | : Thierry Sicard | |

It is certified that error appears in the above-identified patent and that said Letters Patent is hereby corrected as shown below:

In the Claims

At column 14, line 22, please change "transistor to turn," to be --transistor to turn off,--

Signed and Sealed this
Fourteenth Day of May, 2013

Teresa Stanek Rea
*Acting Director of the United States Patent and Trademark Office*